United States Patent
Wilsher et al.

(10) Patent No.: US 6,496,261 B1
(45) Date of Patent: Dec. 17, 2002

(54) DOUBLE-PULSED OPTICAL INTERFEROMETER FOR WAVEFORM PROBING OF INTEGRATED CIRCUITS

(75) Inventors: Kenneth R. Wilsher, Palo Alto, CA (US); William K. Lo, San Jose, CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/500,757

(22) Filed: Feb. 8, 2000

Related U.S. Application Data

(60) Provisional application No. 60/155,844, filed on Sep. 24, 1999.

(51) Int. Cl.[7] .................................................. G01B 9/02
(52) U.S. Cl. ...................................... 356/450; 356/491
(58) Field of Search ................................... 356/450, 491

(56) References Cited

U.S. PATENT DOCUMENTS

| | | |
|---|---|---|
| 4,683,420 A | 7/1987 | Goutzoulis |
| 4,758,092 A | 7/1988 | Heinrich et al. |
| 5,847,570 A | 12/1998 | Takahashi et al. |
| 5,872,360 A | 2/1999 | Paniccia et al. |
| 5,905,577 A * | 5/1999 | Wilsher et al. ............. 356/448 |
| 6,114,858 A | 9/2000 | Kasten |
| 6,252,222 B1 * | 6/2001 | Kasapi et al. ........... 250/214 R |

* cited by examiner

Primary Examiner—Samuel A. Turner
Assistant Examiner—Patrick Connolly
(74) Attorney, Agent, or Firm—Skjerven Morrill LLP; Norman R. Klivans

(57) ABSTRACT

Optical interferometery is used to probe an integrated circuit device under test (DUT). During each cycle of a repetitive electrical test pattern applied to the DUT a reference pulse is provided at a fixed time relative to the test pattern, and a probe pulse is provided at a time scanned through the test pattern in the manner of equivalent time sampling. The probe and reference light pulses are each split to provide at least a second probe pulse and a second reference pulse. One probe pulse and one reference pulse interact with the DUT at the same physical location, but at displaced times with respect to each other. The second probe pulse and the second reference pulse travel an optical delay path with length controlled to compensate for motions of the DUT. The probe pulses are recombined and detected to provide a probe interference signal. The reference pulses are recombined and detected to provide a reference interference signal. For each cycle, electrical activity in the DUT is detected by preparing a ratio of the probe interference signal and the reference interference signal.

37 Claims, 3 Drawing Sheets

DOUBLE-PULSED OPTICAL INTERFEROMETER FOR WAVEFORM PROBING OF INTEGRATED CIRCUITS

CROSS-REFERENCE TO RELATED APPLICATION

This application claims the benefit of U.S. Provisional Application No. 60/155,844, filed Sep. 24, 1999, which is incorporated herein by reference.

BACKGROUND

1. Field of the Invention

This disclosure relates to optical testing of integrated circuits and more particularly to optical interferometric probing of integrated circuits' electrical activity.

2. Description of the Related Art

Electrical activity in integrated circuits can be monitored optically by probing changes in the refractive index and the absorption coefficient induced by varying bias voltages and carrier densities at semiconductor diode junctions. For example, changes in the refractive index and the absorption coefficient of the semiconductor material can be manifested by changes in the intensity of an optical beam reflected from the diode junction.

Paniccia et al. U.S. Pat. No. 5,872,360, incorporated herein by reference, discloses detecting an electric field in the active regions of an integrated circuit. In one embodiment, a laser beam is operated at a wavelength near the band gap of a semiconductor such as silicon. The laser beam is focused onto a P-N (diode) junction such as, for example, the drain region of an MOS transistor, through the back side of the semiconductor substrate. The beam passes through the junction, reflects off the oxide interface and metal behind the junction, and returns back through the junction and out of the silicon surface. Modulation of the electric field in the junction causes amplitude modulation in this reflected beam due to the combined effects of electro-absorption and electro-refraction.

Wilsher et al. U.S. Pat. No. 5,905,577, incorporated herein by reference, discloses dual laser beam probing of integrated circuits. A probe beam is used to sample the waveform on an integrated circuit device under test (DUT) during each cycle of a test pattern signal applied to the DUT. A reference laser beam is also used to sample the DUT at the same physical location sampled by the probe beam. Each reference measurement is made at a fixed time relative to the test pattern, while the probe measurements are scanned through the test-pattern, in the manner normal to equivalent time sampling, to reconstruct the waveform. For each test cycle, the ratio of probe and reference measurements is taken to reduce fluctuations in the probe measurement due to noise.

Changes in the refractive index and the absorption coefficient due to electrical activity in a DUT can also be manifested by phase modulation of an optical beam transmitted through or reflected by the DUT. Probes of phase modulation can be more sensitive than probes of reflectivity to electrical activity in a DUT. Heinrich et al. U.S. Pat. No. 4,758,092, incorporated herein by reference, discloses a method for interferometric measurement of phase modulation of an optical beam by an active semiconductor device. An optical beam is split into two beams which are focused on the DUT. One beam is focused on an active region, where it is phase modulated by a modulated refractive index, and the other beam is focused on an inactive region to provide a reference. The reflected beams are recombined and interfere. Modulation of the intensity of the interfering beams is attributed to modulation of the phase of the probe beam due to electrical activity in the probed region.

Typically, interferometric methods are extremely sensitive to vibration and to temperature changes. In the method of Heinrich et al. the relative phase of the two interfering beams is nominally insensitive to DUT vibration and temperature-induced movements in line with the beam axis. However, on a densely integrated circuit it is very difficult to find suitable points to place the reference beam. Also, there is still sensitivity to motion across the laser beam axis.

What is needed is an interferometric method for waveform probing of integrated circuits that is insensitive to vibration and temperature induced movements of the DUT, and that does not require finding a suitable reference point on the DUT near the active region of interest.

SUMMARY

A method of detecting electrical activity in a semiconductor device as a repetitive electrical test pattern signal is applied to the device includes providing a first probe light pulse at a selected time during each repetition of the electrical test pattern, and providing a first reference light pulse at a time during each repetition of the electrical test pattern displaced relative to the selected time at which the first probe light pulse is provided. The first probe light pulse and the first reference light pulse are each divided to provide at least a second probe light pulse and a second reference light pulse. The first probe light pulse and the first reference light pulse are directed onto a region of the semiconductor device.

After the first probe light pulse and the first reference light pulse interact with the semiconductor device, the first probe light pulse is combined with the second probe light pulse to overlap in space and time, and the first reference light pulse is combined with the second reference light pulse to overlap in space and time. The overlapped probe light pulses are detected to provide a probe interference signal, and the overlapped reference light pulses are detected to provide a reference interference signal. The selected time is varied with the repetition of the electrical test pattern, The ratio of the probe interference signal and the reference interference signal is determined at a plurality of the selected times within the electrical test pattern.

An associated apparatus includes a source of a first probe light pulse, a source of a first reference light pulse, a splitter, a support for the semiconductor device, a beam combiner, a detector system, and a processor for determining a ratio of the probe interference signal and the reference interference signal.

DETAILED DESCRIPTION

Figure 1:
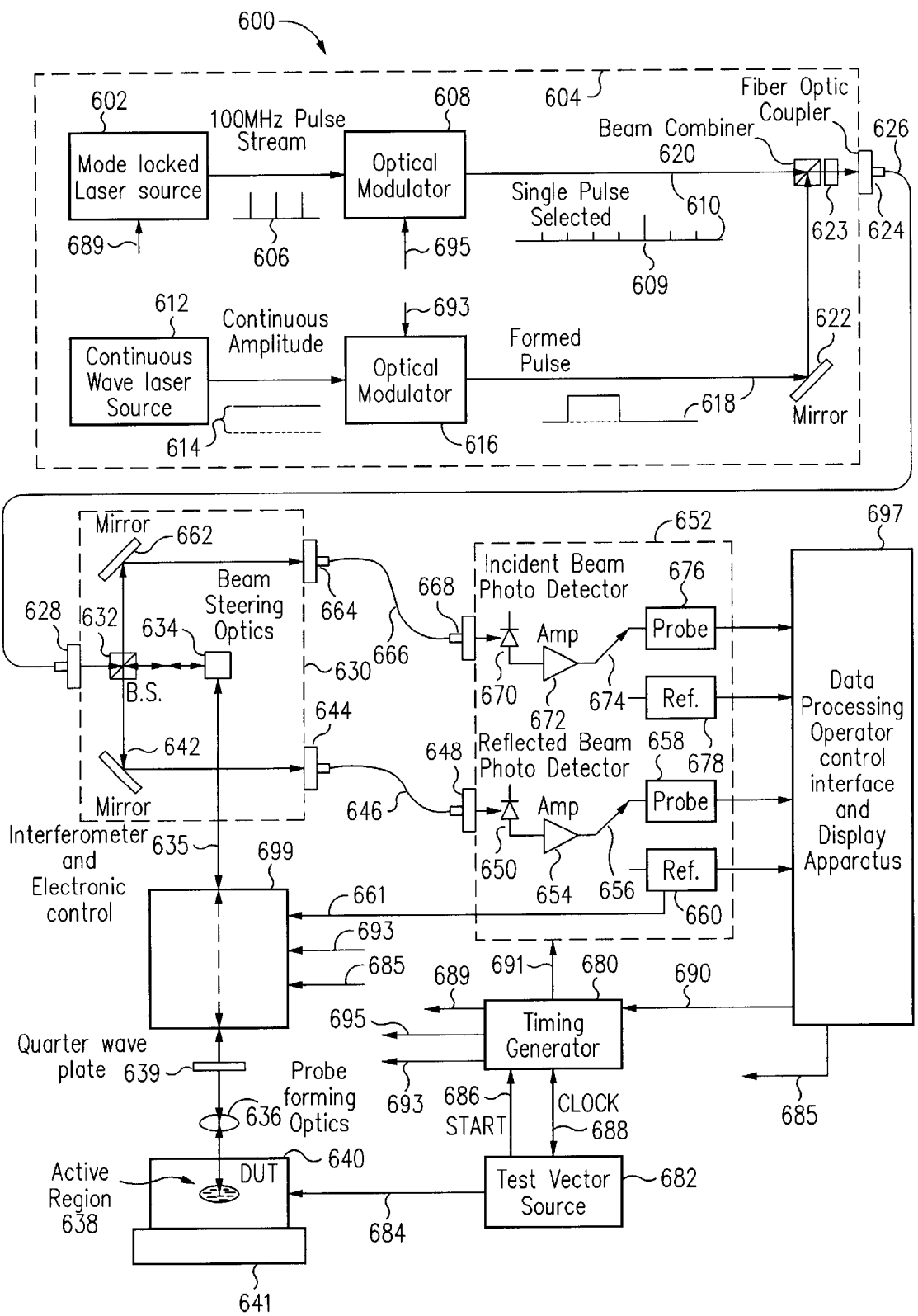
FIG. 1 is a schematic illustration of an apparatus in accordance with one embodiment of the present invention.

Integrated circuits are probed using optical interferometery. During each repeat cycle of an electrical test pattern signal applied repetitively to an integrated circuit device under test (DUT), a probe light pulse and a reference light pulse are provided and travel the same optical path to sample the electrical waveform on the DUT. The probe pulses are short in duration compared to the period of the highest frequency signal of interest in the test pattern, in order to provide a high bandwidth measurement of the test pattern waveform. The reference pulses are typically of longer duration than the probe pulses. The reference pulses are provided at a fixed time relative to the test pattern. The probe pulses are scanned through the test pattern during a series of test pattern cycles, in the manner normal to equivalent time sampling, to reconstruct the DUT waveform.

A portion of each probe and each reference pulse is split off and detected to characterize the energy of the pulses incident on the DUT. In addition, the probe pulse is split in an interferometer to provide at least a first probe pulse and a second probe pulse, and the reference pulse is split in the interferometer to provide at least a first reference pulse and a second reference pulse. The first probe pulse and the first reference pulse sample the waveform on the DUT at the same physical location, but displaced in time by a varying delay as the probe pulse is scanned through the test pattern. The second probe pulse and the second reference pulse travel identical paths in a delay arm of the interferometer.

After interacting with the DUT, the first probe pulse is recombined with the second probe pulse to provide a probe interference signal at a detector. Similarly, after interacting with the DUT, the first reference pulse is recombined with the second reference pulse to provide a reference interference signal at a detector. The probe interference signal varies with time as the probe pulse is scanned in time through the test pattern due to the time varying electrical activity in the DUT, which modulates the optical phase of the first probe pulse as the first probe pulse interacts with the DUT. The probe interference signal also varies with time due to noise caused by mechanical creep, temperature variations, vibrational motion of the DUT, and amplitude noise on the incident probe pulses caused by fluctuations in the output of the probe pulse light source. The reference interference signal varies in time due to noise caused by mechanical creep, temperature variations, motion of the DUT, and amplitude noise on the incident reference pulses. Since the reference pulses are provided at a fixed time with respect to the test pattern, the reference interference signal does not vary with time due to the electrical activity in the DUT.

The reference interference signal is stabilized (made nearly constant) by rapidly adjusting the path length of the delay arm of the interferometer to compensate for motion of the DUT along the optical axis caused by vibration or creep. Advantageously, since the second probe pulse and the second reference pulse travel the same optical path along the delay arm of the interferometer, the adjustments made to the path length of the interferometer delay arm to stabilize the reference interference signal also eliminate the noise in the probe interference signal due to motion of the DUT along the optical axis.

The noise in the probe interference signal due to amplitude noise on the incident probe pulses is canceled by normalizing the probe interference signal by the measured incident probe pulse energy, e.g., by calculating the probe reflectance ratio. Amplitude noise on the incident probe pulses is canceled in the reflectance ratio because the amplitude noise is identically present in the probe interference signal and the measured incident probe pulse energy. Similarly, the noise in the reference interference signal due to amplitude noise on the incident reference pulses is canceled by normalizing the reference interference signal by the measured incident reference pulse energy to provide the reference reflectance ratio.

Temperature variations and motion of the DUT across the optical axis will affect the probe reflectance ratio and the reference reflectance ratio similarly. Noise from these sources is canceled by calculating the ratio of the probe reflectance ratio and the reference reflectance ratio. The remaining modulation of the ratio of the probe reflectance ratio and the reference reflectance ratio represents the waveform of the electrical activity in the DUT.

FIG. 1 is a schematic illustration of a double-pulsed optical interferometer system 600. A mode-locked laser 602 located on conventional laser platform 604 outputs laser pulse train 606. In one embodiment, the mode-locked laser is a Lightwave Electronics Model 131-200 mode-locked Nd:YAG laser providing pulses of ~35 picoseconds (ps) duration at a repetition rate of 100 MHz and a wavelength of 1064 nm. Pulse train 606 passes through optical modulator 608, which selects a probe pulse 609 from pulse train 606, as indicated at 610, for each cycle of a test pattern applied repetitively to a DUT. Optical modulator 608 is, e.g., a Conoptics 360-80 Electro-Optic Modulator with a Conoptics 25D driver, but other optical modulators, such as acousto-optical modulators, can also be used. In one embodiment, optical modulator 608 includes two optical modulators in series to more completely suppress the unwanted pulses in pulse train 606.

Continuous wave laser 612, also located on laser platform 604, outputs a continuous amplitude laser beam 614 to optical modulator 616. In one embodiment, continuous wave laser 612 is a Coherent, Inc. Compass™ Model 1064-500 continuous wave Nd:YAG laser also operating at a wavelength of 1064 nm. Optical modulator 616 is also, e.g., a Conoptics 360-80 Electro-Optic Modulator, but other optical modulators can be used. In one embodiment, optical modulator 616 includes two optical modulators in series. Optical modulator 616 modulates beam 614 to provide a reference pulse 618 as short as 10 ns duration for each cycle of a test pattern applied to a DUT. In one embodiment, the reference pulse has a duration of 150 nanoseconds (ns), and the reference pulse and probe pulse are separated in time by a time delay of about 1.5 microseconds ($\mu$s) to about 1 millisecond (ms), depending on the DUT electrical test pattern.

The probe and reference pulses are directed to a beam combiner 620, such as a CVI Laser Corporation model BS1-1064-10-1025-45P high energy beam splitter, using beam deflecting optics such as mirror 622 as necessary. Beam combiner 620 directs the probe and reference pulses along collinear paths through polarizer 623 to fiber optic coupler 624, which couples the probe and reference pulses into polarization preserving single-mode optical fiber 626. The splitting ratio of beam combiner 620 is chosen such that, after the probe and reference pulse paths are made collinear by beam combiner 620, the energy in the reference pulse is approximately equal to the energy in the probe pulse. Polarizer 623 sets probe and reference pulses to the same polarization state.

Alternatively, the probe and reference pulses are provided by the same light source, such as a single mode-locked laser. In one embodiment, a single output pulse is split by a beam splitter into probe and reference pulses. A variable length optical delay line provides a delay between the probe pulse and the reference pulse. In another embodiment, probe and reference pulses are derived from separate light pulses output from the same laser. Lasers other than mode-locked lasers and incoherent sources such as light emitting diodes are used as light sources in other embodiments to provide probe and reference pulses.

Optical fiber 626 guides the probe and reference pulses to fiber-optic coupler 628, which couples the pulses to scanning system 630 where they are incident on polarizing beam splitter 632. Optical fiber 626 also inherently spatially filters the probe and reference pulses, thereby approximately matching their spatial mode structures. A linearly polarized portion of each probe and reference pulse is transmitted through polarizing beam splitter 632 to beam steering optics 634, which steer the pulses into interferometer 699. The path of the pulses into interferometer 699 is represented by light beam 635. In one embodiment, scanning system 630 is a confocal laser scanning microscope also used to image a device under test.

Figure 2:
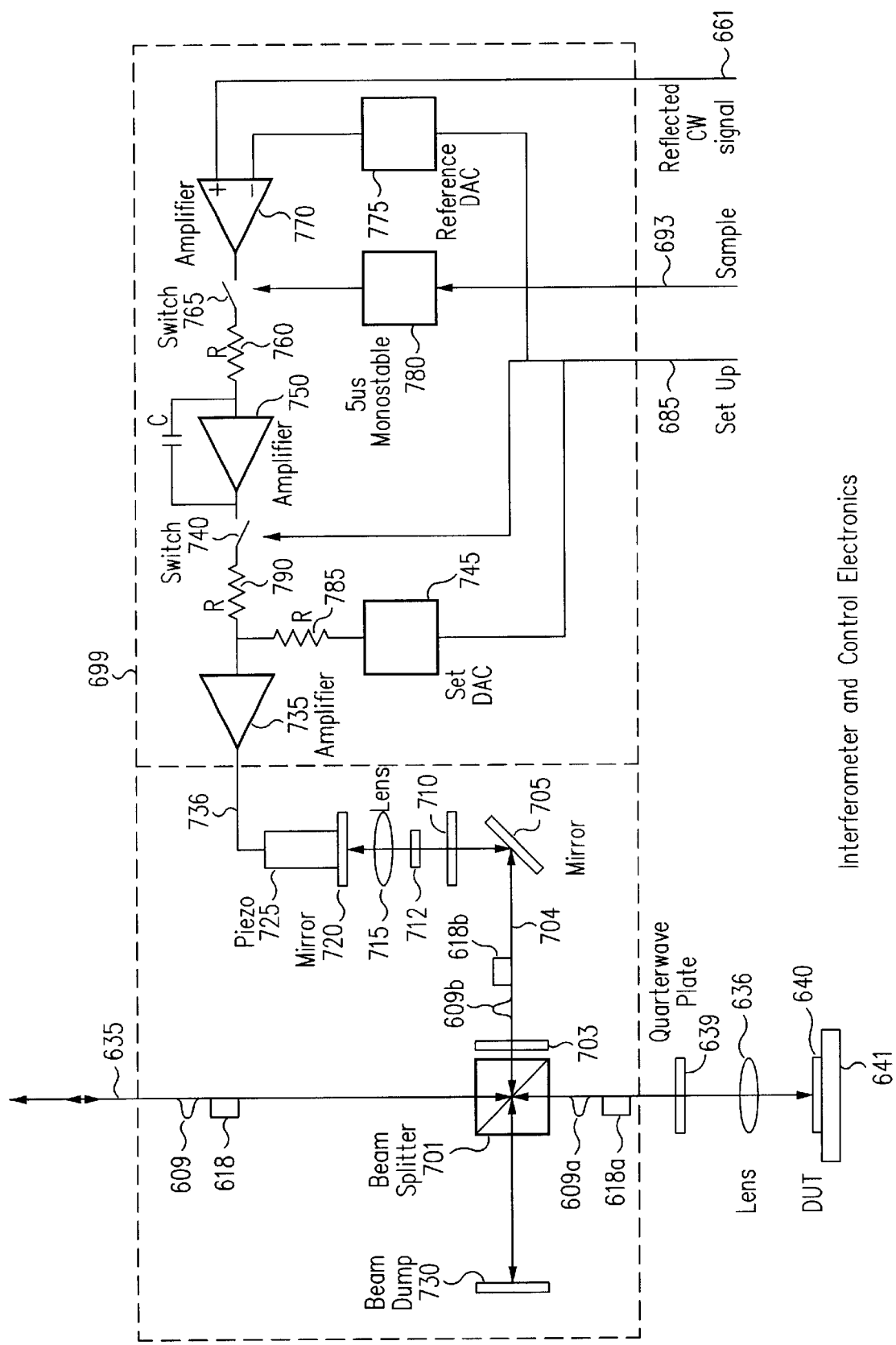
FIG. 2 shows a portion of the apparatus of FIG. 1 in greater detail.

FIG. 2 depicts interferometer 699 and its associated control electronics in detail. Interferometer 699 includes a delay arm, formed by mirror 705, quarter wave plate 710, aperture 712, lens 715 and mirror 720, and a DUT arm, including quarter wave plate 639, objective lens 636, and DUT 640. In one embodiment, DUT 640 is supported by a conventional x-y stage 641. In another embodiment, interferometer 699 and scanning system 630 are supported by an x-y-z stage and moved with respect to a stationary DUT 640. Probe pulse 609 and reference pulse 618 in light beam 635 are incident on nonpolarizing beam splitter 701, which splits each incident pulse into two pulses. For convenience, the portion of each probe pulse 609 transmitted into the DUT arm by beam splitter 701 will be referred to herein as the first probe pulse 609a, and the portion of each probe pulse diverted into the delay arm of interferometer 699 will be referred to herein as the second probe pulse 609b. Similarly, the portion of each reference pulse 618 transmitted into the DUT arm by beam splitter 701 will be referred to herein as the first reference pulse 618a, and the portion of each reference pulse diverted into the delay arm of interferometer 699 will be referred to herein as the second reference pulse 618b.

The first probe pulse 609a and the first reference pulse 618a pass through quarter wave plate 639, which is typically oriented to transform the polarization of the pulses from linear to circular. The circularly polarized first probe pulse 609a and first reference pulse 618a are focused by objective 636 onto the same spot in active region 638 of DUT 640. A portion of each pulse is reflected from the DUT back through objective lens 636, which recollimates the beam, to quarter wave plate 639. Quarter wave plate 639 transforms the polarization of the pulses from circular polarization to the linear polarization orthogonal to their original linear polarization. After passing through quarter wave plate 639, a portion of each of the reflected first probe and first reference pulses passes through beam splitter 701 and returns on beam path 635 to be incident on scanning system 630.

The second probe pulse 609b and second reference pulse 618b are diverted by beam splitter 701, through shutter 703, along interferometer delay arm beam path 704. Shutter 703 is open when the system is used for interferometric measurements. For convenience, beam path 704 is folded by mirror 705. The second probe pulse 609b and second reference pulse 618b pass through quarter wave plate 710 and aperture 712 to lens 715, which focuses the pulses onto mirror 720. The position of mirror 720, which is mounted on piezo actuator 725, is adjusted to reflect the pulses back along their incident path. The reflected pulses pass back through lens 715, aperture 712, and quarter wave plate 710 to mirror 705, which steers the pulses through shutter 703 to beam splitter 701. Quarter wave plate 710 is oriented such that the reflected pulses, after twice passing through quarter wave plate 710, are linearly polarized with polarization orthogonal to their original polarization and matching that of the reflected first probe and first reference pulses. Aperture 712 adjusts the diameters of the reflected probe and reference beams in the delay arm to match the diameters of the reflected probe and reference beams in the DUT arm.

A portion of each of the reflected second probe and second reference pulses is diverted by beam splitter 701 back along beam path 635 to return with the portions of the reflected first probe pulse and reflected first reference pulse to scanning system 630. Thus beam splitter 701 also functions as a beam combiner. In one embodiment, the splitting ratio of beam splitter 701 is chosen such that for a typical reflected signal from DUT 640, the ratio of the energy in the reflected first reference pulse (reflected from DUT 640) to that in the reflected second reference pulse (reflected from mirror 720) is about 1:3 as they exit the interferometer. In another embodiment, the splitting ratio is chosen so that the ratio of reflected reference pulse energies is about 1:1. In another embodiment, the ratio of reflected reference pulse energies is adjusted by inserting a power attenuator, such as a neutral density filter, in the delay arm path.

The position of mirror 720 is adjusted such that the reflected first and second probe pulses are overlapped in space and time as they return along beam path 635 to scanning system 630. The reflected first and second reference pulses are consequently also overlapped in space and time as they return along beam path 635 to scanning system 630. As the probe pulses are very short (~35 ps), the length of the interferometer delay arm (the delay path length) must be made equal to or nearly equal to the length of the interferometer DUT arm to overlap the pulses. In one embodiment, mirror 720, piezo actuator 725, and lens 715 are mounted on a slide which allows for coarse adjustment of the delay path length.

Referring again to FIG. 1, the reflected pulses return along beam path 635 to beam steering optics 634, which steers the reflected pulses to polarizing beam splitter 632. The reflected pulses, with linear polarization orthogonal to their original linear polarization, are diverted by polarizing beam splitter 632 to mirror 642, which reflects the reflected pulses to fiber-optic coupler 644. Fiber-optic coupler 644 couples the reflected pulses into multimode optical fiber 646, which guides the reflected pulses to fiber-optic coupler 648. Fiber-optic coupler 648 couples the reflected pulses onto reflected beam photodetector 650 within signal processing subsystem 652.

The reflected first and second probe pulses, which overlap in space and time, generate an interference electrical signal in photodetector 650 with magnitude determined by the optical phase difference between the two reflected probe pulses. Similarly, the reflected first and second reference pulses also produce an interference electrical signal in photodetector 650 with magnitude determined by the optical phase difference between the two overlapping reflected reference pulses. Photodetector 650 outputs an electrical current pulse at the input terminal of transimpedance amplifier 654 for each pair of reflected probe pulses and for each pair of reflected reference pulses.

Transimpedance amplifier 654 converts the current pulses from photodetector 650 into output voltage pulses, which are coupled by fast operating switch 656 to energy analyzer 658 for probe pulse interference signals, and alternatively to energy analyzer 660 for reference pulse interference signals. Probe and reference light pulses are sufficiently separated in time for the output voltage pulses, which are typically 600 ns in duration due to the limited bandwidth of transimpedance amplifier 654, to be distinguishable from each other. The voltage-time integral of an output voltage pulse is a measure of the energy in the corresponding interference signal. Energy analyzers 658 and 660 each conventionally contain an integrator and an analog to digital converter, and thereby output 14 bit digital representations of the energy in the probe and reference interference signals, respectively.

A portion of each incident probe and reference pulse incident on to scanning system 630 from optical fiber 626 and fiber-optic coupler 628 is diverted by polarizing beam splitter 632 to mirror 662, which directs the pulses to fiber-optic coupler 664. Fiber-optic coupler 664 couples the pulses into multimode optical fiber 666, which guides the pulses to fiber-optic coupler 668. Fiber-optic coupler 668 couples the incident pulses onto incident beam photodetector 670 within signal processing subsystem 652.

Photodetector 670 outputs a current pulse at the input terminal of transimpedance amplifier 672 for each incident light pulse it detects. Transimpedance amplifier 672 converts the current pulses from photodetector 670 into output voltage pulses, which are coupled by fast operating switch 674 to energy analyzer 676 for incident probe pulse signals, and to energy analyzer 678 for incident reference pulse signals. Energy analyzers 676 and 678 each conventionally contain an integrator and an analog to digital converter, and output 14 bit digital representations of the energy in the detected incident probe and reference pulses, respectively.

In one embodiment, photodetectors 650 and 670 are Fermionics Corporation model FD300 Indium Gallium Arsenide (InGaAs) PIN photodiodes, and transimpedance amplifiers 654 and 672, fast switches 656 and 674, and pulse energy analyzers 658, 660, 676, and 678 are as disclosed in Wilsher et al. U.S. Pat. No. 5,905,577.

Timing generator 680 controls the timing of the operation of double-pulsed optical interferometer system 600. Timing generator 680 is coupled to test vector source 682, mode-locked laser 602, optical modulator 608, optical modulator 616, signal processing subsystem 652, interferometer 699, and data processing and control apparatus 697. In one embodiment, timing generator 680 is a timing generator disclosed in Wilsher et al. U.S. Pat. No. 5,905,577 for timing generator control of a dual laser probe system.

Data processing and control apparatus 697 is typically a programmable general-purpose digital computer processor with a video display terminal and conventional high-speed data acquisition and digital signal processing circuit boards.

In one embodiment, test vector source 682 is a Schlumberger ITS9000 logic test system. Other test vector sources, such as simple data generators, can also be used if their clocks are sufficiently accurate and stable. Test vector source 682 repeatedly outputs a sequence of test vectors (a test pattern) to DUT 640 on multiple lines 684. The test pattern cycles continuously. That is, when test vector source 682 sends the last vector in the test pattern, it loops back to the starting vector and begins sending the test pattern again. The test pattern is typically from about a few microseconds to a few milliseconds in length.

In one embodiment the mode locked laser pulse train 606 and the test pattern loop provided by test vector source 682 are phase locked. Of course, this does not refer to the optical phase of individual laser pulses but refers instead to the phase of the periodic pulse train with respect to the phase of the periodic test pattern loop. Phase locking the pulse train and the test pattern loop requires that there is an integral number of mode-locked laser pulse periods in one test pattern loop period. For example, in the case of a 100 MHz mode-locked laser pulse repetition rate, this requires that the test pattern loop is an integral number of 10 ns periods in length.

In one embodiment, timing generator 680 receives a clock signal 688 from test vector source 682 and, by well known phase locked loop techniques, derives a clock signal 689 of the correct frequency to drive mode locked laser 602 phase locked to the test pattern loop. An alternative method is for timing generator 680 to generate and provide both clock signal 689 to mode-locked laser 602 and clock signal 688 to test vector source 682.

Test vector source 682 outputs a start signal on line 686 at the beginning of every cycle of the test pattern loop. The start signal on line 686 is used to start a timing sequence in timing generator 680. At a predetermined time after receiving the start signal on line 686, timing generator 680 sends a control signal on line 693 to optical modulator 616. On receiving the control signal on line 693, optical modulator 616 defines reference light pulse 618 by allowing continuous amplitude beam 614 from continuous wave laser 612 to pass for about 150 ns. Similarly, at a predetermined time after receiving the start signal on line 686, timing generator 680 sends a control signal on line 695 to optical modulator 608. On receiving the control signal on line 695, optical modulator 608 defines probe light pulse 610 by allowing one pulse in pulse train 606 to pass. Also, at predetermined times after receiving the start signal on line 686, timing generator 680 sends control signals on line 691 to signal processing subsystem 652 such that fast switches 656 and 674 in response appropriately switch so as to direct voltage pulses from the output terminals of transimpedance amplifiers 654 and 672 to pulse energy analyzers 658, 660, 676, and 678, as described above. The timing of the control signals on lines 689, 691, 693, and 695 is set by data processing and control apparatus 697, typically programmed by a user, and communicated to timing generator 680 with control signals on line 690.

The four 14 bit digital output signals from signal processing subsystem 652 are coupled to data processing and control apparatus 697. Thus for every cycle of the test pattern, data processing and control apparatus 697 receives four data input signals representing the incident probe and incident reference pulse energies and the probe and reference interference signal energies.

Data processing and control apparatus 697 acquires the electrical signal on DUT 640 by collecting data from the four pulse energy analyzers as the reference pulses are maintained in a constant timing position relative to the start signal on line 686 and the probe pulses are moved through a series of fixed timing positions relative to the start signal on line 686 in the manner of equivalent time sampling. Typically, 500 different timing positions are used. The ratio of the probe and reference reflectance ratios is calculated for each of the probe timing positions, and interpreted as representing the voltage changes on DUT 640 corresponding to the test pattern waveform.

In one embodiment, a single iteration of the probe pulses through the series of timing positions is made. During this iteration, the probe pulses remain at each timing position for many thousands of test pattern cycles to enable reduction of waveform noise through averaging or other processing of the collected data. In another embodiment, about 10 to about 1000 iterations through the series of timing positions are made. During these iterations, the probe pulses remain at each timing position for about 10 to about 100 test pattern cycles.

Optical modulator 608 does not completely block unwanted pulses in modelocked pulse train 606. Vestigial modelocked pulses leak through optical modulator 608, and produce offset signals in photodetectors 650 and 670. In one embodiment, a method disclosed in Wilsher et al. U.S. Pat. No. 5,905,577 is used whereby the magnitudes of the offset signals are determined and subtracted from the probe and reference interference signals.

The magnitudes of the probe and reference interference signals are very sensitive to the difference in optical path lengths between the DUT arm and the delay arm in interferometer 699. Consequently, the interference signals are very sensitive to the position of DUT 640 along the optical axis established by the incident probe and reference pulses. The position of DUT 640 along the optical axis is referred to herein as the Z position of DUT 640.

The sensitivity of the interference signals to the Z position of DUT 640 is demonstrated by the following example. Consider a beam of reference pulses reflected from DUT 640, i.e., reflected first reference pulses, and call it beam A. Consider also a beam of reference pulses reflected from interferometer delay arm mirror 720, i.e., reflected second reference pulses, and call it beam B. Assume that the position of mirror 720 is adjusted to maximize the overlap of pairs of reflected first and second reference pulses in time and space at photodetector 650. Assuming that the power of beam A does not change with the Z position of DUT 640, and also that the power of beam B does not change with mirror 720 position, then as the Z position of DUT 640 moves over a distance of one quarter wavelength of light, the total power detected in the interference signal by photodetector 650 will vary about the power sum of A and B. From basic optical theory, the maximum and minimum powers found in this range of Z positions, corresponding to constructive and destructive interference conditions, will be $(A^{1/2}+B^{1/2})^2$ and $(A^{1/2}-B^{1/2})^2$, respectively. The average power will be A+B. For example, if the power in beam A is 1 microwatt ($\mu$W) and the power in beam B is 3 $\mu$W, then the maximum detected power is 7.46 $\mu$W, the minimum detected power is 0.536 $\mu$W, and the average detected power is 4 $\mu$W. The photodetector output variation with Z position, assuming that the wavelength of the light pulses is 1064 nm, is shown by the sinusoidal curve 830 in FIG. 3. It can be seen that a change of Z position of 0.1 microns, corresponding, for example, to a small amplitude vibration of DUT 640, causes a very large change in detected power.

In the embodiment illustrated in FIG. 2, the extreme sensitivity of the interference signals to the Z position of DUT 640 is ameliorated by providing closed loop control of the position of mirror 720. The position of mirror 720 is controlled so as to maintain the reference interference signal at photodetector 650 approximately constant as DUT 640 moves. In an alternative embodiment, a fast actuator is similarly provided at DUT 640, as part of supporting stage 641 for example, and controlled to counter the motion of DUT 640 at its source. The following description of the control apparatus and methods applies to both embodiments.

Referring to FIG. 1 and FIG. 2, DUT 640 is imaged, with shutter 703 closed to prevent any interference patterns on the image, by raster scanning the probe or reference beam across DUT 640 with beam steering optics 634. The incident beam of probe and reference pulses is then aligned with a region of interest on DUT 640 by beam steering optics 634, and shutter 703 and switch 740 are opened. Data processing and control apparatus 697 sends control signals on line 685 to DAC 745, which cause DAC 745 to produce a voltage on its output terminal which produces a current in resistor 785. Amplifier 735 produces a voltage on its output terminal proportional to the sum of the currents on its input terminal from resistors 785 and 790. The output voltage from amplifier 735 is coupled to piezo actuator 725, which is attached to mirror 720. Actuator 725 moves mirror 720 over a range of about 6 microns for a change in amplifier 735 output voltage of about 100 V.

With switch 740 open, the current through resistor 790 is zero and the output signal of amplifier 735 is controlled by the output signal of DAC 745. Data processing and control apparatus 697 sets a series of voltages on the output terminal of DAC 745, which causes actuator 725 to move mirror 720 and thus change the path length of the delay arm, and records the reference interference signals represented by the digital outputs on pulse energy analyzer 660.

For any Z position of DUT 640, a position of mirror 720 is found in a half wavelength range that will give a detected reference interference signal power at photodetector 650 at the center of the reference interference signal power range. In the example described above, this power level is 4 $\mu$W. A voltage representing this mid-point power is set on the output of a DAC 775 by data processing and control apparatus 697 and used as the reference input to a difference amplifier 770. An analog signal 661 produced by pulse energy analyzer 660 and representing the magnitude of the reference interference signal is used as the other input to difference amplifier 770. Data processing and control apparatus 697 sets the output signal of DAC 745 to mid scale, which sets the output of amplifier 735 to about 50 volts.

Data processing and control apparatus 697 then closes switch 740 to pass a current from the output terminal of integrating amplifier 750 through resistor 790 to the input terminal of amplifier 735. The difference between the reference DAC 775 output signal and analog output signal 661 from pulse energy analyzer 660 appears on the output terminal of difference amplifier 770. Timing generator 680 sends control signals on line 693 to monostable circuit 780, as well as to optical modulator 616 as described above. Monostable circuit 780 closes switch 765 for about 5 $\mu$s at intervals longer than about 100 $\mu$s. If the output signal of difference amplifier 770 is not zero volts when switch 765 is closed, a current is passed though resistor 760 to integrating amplifier 750, changing the voltage at the output terminal of amplifier 750 and the current passed through resistor 790 and, via amplifier 735 and piezo actuator 725, changing the position of mirror 720.

Amplifiers 770, 750, and 735 form a negative feedback loop controlling the position of mirror 720. As the DUT 640 Z position changes, the negative feedback loop changes the position of mirror 720 to maintain the detected reference interference signal at the center of its power range (4 $\mu$W in the above example). Mirror 720 has a small mass, so the feedback loop is able to follow vibrations of DUT 640 over the frequency range DC to about 200 Hz or greater. The position of mirror 720 can be controlled by piezoelectric device 725 or by a moving coil electromagnetic device. As noted previously, the feedback could be applied to a similar actuator at DUT 640 to counter vibrations at their source, though with more difficulty as DUT 640 is typically more massive than mirror 720.

Figure 3:
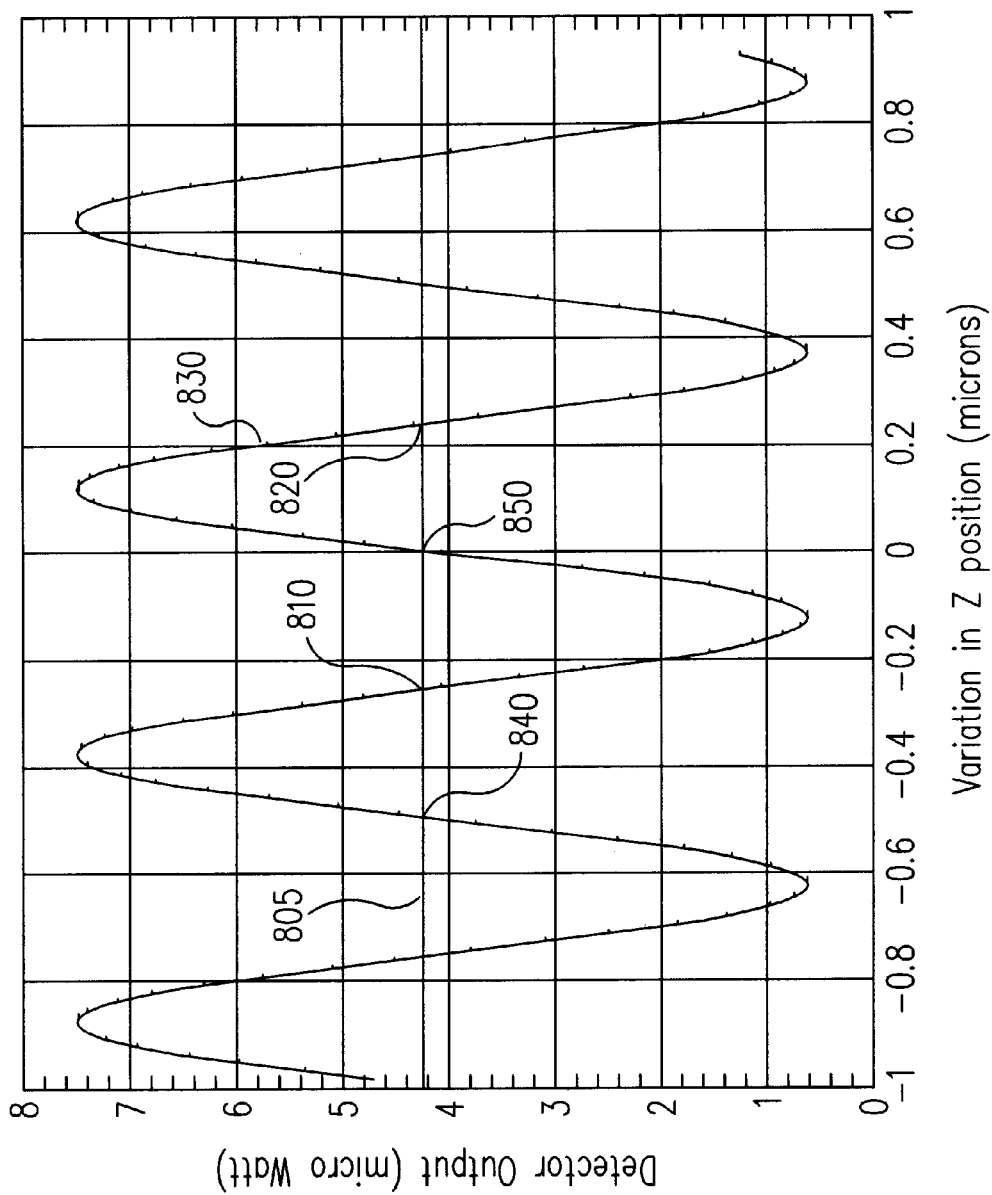
FIG. 3 shows interference signals explaining the operation of the apparatus of FIG. 1.

The detected reference interference signal power as a function of the mismatch of the optical path lengths of the interferometer DUT arm and the interferometer delay arm is also represented by curve 830 in the graph of FIG. 3. The reference level produced by DAC 775 is indicated by line 805. It can be seen that with the feedback loop enabled, there are several stable (negative feedback) and unstable (positive feedback) mirror positions where the reference interference signal power 830 is equal to reference level 805. These positions occur at points 810, 820, 840, and 850. In the absence of vibration of DUT 640, the position of the mirror, 720, will be driven away from the unstable points towards one of the stable points, coming to settle very nearly exactly on one of the stable points. Circuitry can be provided to invert the electronic gain in the feedback loop so that the position of the stable and unstable points can be reversed. It is important that the feedback system is effective enough to be able to maintain operation near this stable point in the presence of normal DUT vibration, otherwise the feedback system will be constantly searching for a new stable operating point. As is well known in the art, the effectiveness of the feedback system is determined, in part, by the gain and bandwidth of amplifiers 735, 750, and 770, by the response time of piezo actuator 725 with mirror 720 attached to it, and by the frequency with which switch 765 is closed to sample the output of amplifier 770 and thus analog signal 661.

In one embodiment, timing generator 680 is modified to provide a control signal on line 693 more than once for each cycle of the test pattern output by test vector source 682. Thus reference pulse 618 is defined and switch 765 is closed more than once per test pattern cycle, thereby increasing the rate at which the feedback system samples analog signal 661.

Any difference in light wavelength between the probe and reference lasers causes the probe and reference interference patterns to differ. If the probe laser had a shorter optical wavelength than the reference laser, for example, then the detected probe interference signal as a function of the mismatch between the optical path lengths of the DUT and delay arms would be represented by a sinusoidal curve similar to curve 830 in FIG. 3, but of shorter wavelength. Consequently, for sufficiently large mismatches in optical path length, variations in the probe interference signal due to motions of DUT 640 are not compensated for by the movements of mirror 720 which stabilize the reference interference signal. If the nominally 1064 nm wavelength lasers differ by about 0.5 nm, for example, the mismatch in optical path length between the DUT arm and the delay arm should be less than about 50 $\mu$m.

If a confocal microscope is used to transmit the beams of probe and reference pulses to DUT 640, then vibrations of DUT 640 can change the amplitude of the reflected pulses as well as their optical phase. Consequently, some movements of mirror 720 will be made to compensate for an amplitude change in the reflected light rather than a phase change in the reflected light. Since DUT 640 is at the focus of objective lens 636, these amplitude changes are expected to be small enough, typically less than +/−10% over the focal range of interest, that they will be compensated by sufficiently small mirror movements for this effect to be neglected.

Variations in the amplitude of the incident reference pulses will similarly lead to erroneous compensating movement of mirror 720. In one embodiment, these errors are avoided by driving the feedback loop with the reference pulse reflectance ratio rather than with the reference pulse interference signal. The reference pulse amplitude variations are typically less than 5%, however, and thus small enough that the errors introduced by the erroneous movements of mirror 720 can be neglected.

This disclosure is illustrative and not limiting. Further modifications will be apparent to one skilled in the art in light of this disclosure and are intended to fall within the scope of the appended claims.

We claim:

1. A method of detecting activity in a semiconductor device as a repetitive electrical test pattern is applied to the device, comprising the acts of:

providing a first probe light pulse at a selected time during each repetition of the test pattern and dividing the first probe light pulse to provide at least a second probe light pulse;

providing a first reference light pulse at a time during each repetition of the test pattern displaced relative to the selected time at which the first probe light pulse is provided and dividing the first reference light pulse to provide at least a second reference light pulse;

directing the first probe light pulse and the first reference light pulse onto the semiconductor device;

combining the first probe light pulse with the second probe light pulse and the first reference light pulse with the second reference light pulse, after the first probe light pulse and the first reference light pulse interact with the semiconductor device, such that the first probe light pulse and the second probe light pulse overlap in space and time and the first reference light pulse and the second reference light pulse overlap in space and time;

detecting the overlapped probe light pulses thereby to provide a probe interference signal;

detecting the overlapped reference light pulses thereby to provide a reference interference signal; and determining a function of the probe interference signal and the reference interference signal.

2. The method of claim 1 further comprising varying the selected time with the repetition of the test pattern such that the function of the probe interference signal and the reference interference signal is determined at a plurality of the selected times within the test pattern.

3. The method of claim 1 wherein the first probe light pulse is a laser light pulse.

4. The method of claim 3 further comprising selecting the laser light pulse from a train of mode-locked laser light pulses.

5. The method of claim 4 further comprising phase locking the train of mode-locked laser light pulses and the repetitive test pattern.

6. The method of claim 1 wherein the first reference light pulse is a laser light pulse.

7. The method of claim 6 further comprising modulating a laser beam to provide the laser light pulse.

8. The method of claim 1 wherein the probe light pulses and the reference light pulses are of about the same wavelength.

9. The method of claim 1 further comprising fixing the time during each repetition of the electrical test pattern at which the first reference light pulse is provided with respect to the test pattern.

10. The method of claim 1 further comprising directing the first probe light pulse and the first reference light pulse along a same path onto the semiconductor device.

11. The method of claim 1 further comprising directing the second probe light pulse and the second reference light pulse along a delay path before the second probe light pulse is combined with the first probe light pulse and the second reference light pulse is combined with the first reference light pulse.

12. The method of claim 11 further comprising feedback controlling a length of said delay path to compensate for a motion of the semiconductor device.

13. The method of claim 12 wherein the feedback controlling stabilizes the reference interference signal.

14. The method of claim 1 further comprising amplifying the probe interference signal, integrating the probe interference signal, and digitizing the probe interference signal.

15. The method of claim 1 further comprising amplifying the reference interference signal, integrating the reference interference signal, and digitizing the reference interference signal.

16. The method of claim 1 wherein the acts of detecting the overlapped probe light pulses and detecting the overlapped reference light pulses comprise detecting the overlapped probe light pulses and the overlapped reference light pulses to provide a detector signal, integrating and digitizing a portion of the detector signal to provide a probe interference signal, and integrating and digitizing a portion of the detector signal to provide a reference interference signal.

17. The method of claim 1 further comprising canceling an amplitude noise in the probe interference signal and the reference interference signal.

18. The method of claim 17 wherein the act of canceling an amplitude noise comprises detecting a portion of a probe light pulse energy, detecting a portion of a reference light pulse energy, normalizing the probe interference signal by the portion of the probe light pulse energy, and normalizing the reference interference signal by the portion of the reference light pulse energy.

19. An apparatus for detecting activity in a semiconductor device as a repetitive electrical test pattern is applied to the device, comprising:
- a source of a first probe light pulse, thereby outputting a first probe light pulse at a selected time during each repetition of the electrical test pattern;
- a source of a first reference light pulse, thereby outputting a first reference light pulse at a time displaced relative to the selected time at which the first probe light pulse is provided;
- a splitter onto which the first probe light pulse and first reference light pulse are incident, whereby at least a second probe light pulse and a second reference light pulse are provided;
- a support for the semiconductor device onto which the first probe light pulse and first reference light pulse are incident;
- a beam combiner, located to combine the first probe light pulse and the second probe light pulse, and to combine the first reference light pulse and the second reference light pulse, after the first probe light pulse and the first reference light pulse interact with the semiconductor device;
- a detector located to detect the first probe light pulse and the second probe light pulse, thereby to output a probe interference signal and to detect the first reference light pulse and the second reference light pulse, thereby to output a reference interference signal; and
- a processor coupled to the detector, thereby to determine a function of the probe interference signal and the reference interference signal.

20. The apparatus of claim 19 wherein the selected time is varied with the repetition of the electrical test pattern such that the function of the probe interference signal and the reference interference signal is determined at a plurality of the selected times within the test pattern.

21. The apparatus of claim 19 wherein the source of the first probe light pulse comprises a first laser, and the source of the first reference light pulse comprises a second laser.

22. The apparatus of claim 19 wherein the source of the first probe light pulse and the source of the first reference light pulse comprise a same laser.

23. The apparatus of claim 19 wherein the source of the first probe light pulse is a laser.

24. The apparatus of claim 23 wherein the laser is a mode-locked laser, and further comprising an optical modulator located to select the first probe light pulse from a train of mode-locked laser light pulses.

25. The apparatus of claim 24 wherein the train of mode-locked laser light pulses and the repetitive test pattern are phase locked.

26. The apparatus of claim 19 wherein the source of the first reference light pulse is a laser.

27. The apparatus of claim 26 further comprising an optical modulator and wherein an output beam of the laser is modulated by the optical modulator to provide the first reference light pulse.

28. The apparatus of claim 19 wherein the probe light pulses and the reference light pulses are of about the same wavelength.

29. The apparatus of claim 19 wherein the time during each repetition of the test pattern at which the first reference light pulse is provided is fixed with respect to the test pattern.

30. The apparatus of claim 19 wherein the first probe light pulse and the first reference light pulse are directed along a same path onto the semiconductor device.

31. The apparatus of claim 19 further comprising a delay path along which the second probe light pulse and second reference light pulse are directed.

32. The apparatus of claim 31 further comprising a feedback loop coupled to the delay path whereby a length of the delay path is controlled to compensate for motion of the semiconductor device.

33. The apparatus of claim 32 wherein the feedback loop stabilizes the reference interference signal.

34. The apparatus of claim 19 wherein the detector comprises a photodetector located to detect the first probe light pulse and the second probe light pulse and to output a probe interference signal, an amplifier coupled to receive the probe interference signal, an integrator coupled to receive the amplified probe interference signal, and a digitizer coupled to receive the integrated probe interference signal.

35. The apparatus of claim 19 wherein the detector comprises a photodetector located to detect the first reference light pulse and the second reference light pulse and to output a reference interference signal, an amplifier coupled to receive the reference interference signal, an integrator coupled to receive the amplified reference interference signal, and a digitizer coupled to receive the integrated reference interference signal.

36. The apparatus of claim 19 further comprising a splitter located to divert a portion of a probe light pulse, a photodetector located to detect the portion of the probe light pulse and to output a photodetector signal, an amplifier coupled to receive the photodetector signal, an integrator coupled to receive the amplified photodetector signal, and a digitizer coupled to receive the integrated photodetector signal.

37. The apparatus of claim 19 further comprising a splitter located to divert a portion of a reference light pulse, a photodetector located to detect the portion of the reference light pulse and to output a photodetector signal, an amplifier coupled to receive the photodetector signal, an integrator coupled to receive the amplified photodetector signal, and a digitizer coupled to receive the integrated photodetector signal.

\* \* \* \* \*